(12) United States Patent
Lien

(10) Patent No.: US 6,754,093 B2
(45) Date of Patent: Jun. 22, 2004

(54) CAM CIRCUIT WITH RADIATION RESISTANCE

(75) Inventor: Chuen-Der Lien, Los Altos Hills, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 13 days.

(21) Appl. No.: 10/165,506

(22) Filed: Jun. 6, 2002

(65) Prior Publication Data

US 2003/0227788 A1 Dec. 11, 2003

(51) Int. Cl.[7] .............................................. G11C 15/00
(52) U.S. Cl. ..................... 365/49; 365/149; 365/227
(58) Field of Search ........................ 365/49, 149, 154, 365/156, 227, 228, 189.07

(56) References Cited

U.S. PATENT DOCUMENTS

| 4,506,436 A | 3/1985 | Bakeman, Jr. et al. |
| 4,779,226 A | 10/1988 | Haraszti |
| 4,791,606 A | 12/1988 | Threewitt et al. |
| 4,876,215 A | 10/1989 | Hsu |
| 5,561,429 A | 10/1996 | Halberstam et al. |
| 5,572,460 A | 11/1996 | Lien |
| 5,681,769 A | 10/1997 | Lien |
| 6,067,656 A | 5/2000 | Rusu et al. |
| 6,146,936 A | 11/2000 | Manning |
| 6,512,685 B1 * | 1/2003 | Lien et al. ............ 365/49 |
| 6,560,156 B2 * | 5/2003 | Lien et al. ............ 365/222 |

* cited by examiner

Primary Examiner—Gene Auduong
(74) Attorney, Agent, or Firm—Bever, Hoffman & Harms LLP

(57) ABSTRACT

A CMOS CAM circuit an array of CAMs formed on a p-type substrate. Each CAM cell includes a logic portion and an SRAM cell, both having at least one n-channel transistor formed in a p-type well on the p-type substrate. An n-type doped layer is formed between the p-type well region and the p-substrate that attracts electron-hole pairs formed by alpha particles, thereby preventing soft errors. Alternatively, the logic portions and SRAM cells have p-channel transistors formed in n-type wells on an n-type substrate, and a p-type doped layer is formed between the n-type well region and the n-substrate.

17 Claims, 3 Drawing Sheets

CAM CIRCUIT WITH RADIATION RESISTANCE

FIELD OF THE INVENTION

The present invention relates to integrated content addressable memory (CAM) arrays, and in particular to low-power CAM arrays.

DISCUSSION OF RELATED ART

Conventional random access memory (RAM) arrays include RAM cells (e.g., static RAM (SRAM) cells, dynamic RAM (DRAM) cells, and non-volatile RAM (NVRAM) cells) that are arranged in rows and columns, and addressing circuitry that accesses a selected row of RAM cells using address data corresponding to the physical address of the RAM cells within the RAM array. A data word is typically written into a RAM array by applying physical address signals to the RAM array input terminals to access a particular group of RAM cells, and applying data word signals to the RAM array input terminals that are written into the accessed group of RAM cells. During a subsequent read operation, the physical address of the group of RAM cells is applied to the RAM array input terminals, causing the RAM array to output the data word stored therein. Groups of data words are typically written to or read from the RAM array one word at a time. Therefore, a relatively small portion of the entire RAM array circuitry is activated at one time to perform each data word read/write operation, so a relatively small amount of switching noise occurs within the RAM array, and the amount of power required to operate the RAM array is relatively small.

In contrast to RAM arrays, content addressable memory (CAM) arrays store data values that are accessed in response to their content, rather than by a physical address. Specifically, during compare (search) operations, a CAM array receives a searched-for data value that is simultaneously compared with all of the data words stored in the CAM array. In response to each searched-for data value applied to the CAM array input terminals, the rows of CAM cells within the CAM array assert or de-assert associated match signals indicating whether or not one or more data values stored in the CAM cell rows match the applied data value. Therefore, large amounts of data can be searched simultaneously, so CAM arrays are often much faster than RAM arrays in performing certain functions, such as search engines.

While CAM arrays are faster than RAM arrays in performing search functions, they consume significantly more power and generate significantly more switching noise than RAM arrays. In particular, in contrast to RAM arrays in which only a small portion of the total circuitry is accessed during each read and write operation, significantly more power is needed (and noise is generated) in a CAM array because, during compare (search) operations, all of the CAM cells are accessed simultaneously, and those CAM cells that do not match the applied search data value typically switch an associated match line from a high voltage to a low voltage. Switching the large number of match lines at one time consumes a significant amount of power.

To reduce the total power consumed by CAM arrays, there is a trend toward producing CAM arrays that operate on low system (operating) voltages. To facilitate lower system voltages, the integrated circuit (IC) fabrication technologies selected to produce such CAM arrays utilize smaller and smaller feature sizes. In general, the smaller the feature size of an IC, the lower the operating voltage that is used to operate the IC. However, when IC feature sizes and operating voltages are reduced too much, the amount of charge stored at each node within the CAM array becomes so small that a "soft error" problem arises, which is discussed below with reference to FIG. 1.

FIG. 1 is a simplified cross sectional view showing an exemplary IC feature (e.g., a drain junction utilized to form an n-type transistor) that comprises an n-type diffusion (node) 50 formed in p-type well (P-WELL) 51, which in turn is formed in a p-type substrate 52. Dashed line capacitor 53 represents the capacitance of node 50, and indicates that node 50 stores a positive charge.

As indicated in FIG. 1, if an energetic particle, such as an alpha particle (α), from the environment or surrounding structure strikes the n-type diffusion of node 50, then electrons (e) and holes (h) will be generated within the underlying body of semiconductor material (i.e., in p-well 51 or p-type substrate 52). These free electrons and holes travel to the node 50 and p-well 51/p-substrate 52, respectively, thereby creating a short circuit current that reduces the charge stored at node 50. If the energy of the alpha particle is sufficiently strong, or if the capacitance 53 is too small, then node 50 can be effectively discharged. When node 50 forms a drain in an SRAM cell and the charge perturbation is sufficiently large, the stored logic state of the SRAM cell may be reversed (e.g., the SRAM cell can be flipped from storing a logic "1" to a logic "0"). This radiation-produced data change is commonly referred to as a "soft error" because the error is not due to a hardware defect and the cell will operate normally thereafter (although it may contain erroneous data until rewritten).

Many approaches have been proposed for dealing with soft errors, such as increased cell capacitance or operating voltage, and error detection schemes (such as using one or more parity bits). While these proposed approaches are suitable for standard RAM arrays, they are less desirable in CAM arrays. As pointed out above, CAM arrays inherently consume more power than RAM arrays. Therefore, while increased cell size and/or operating voltage can be tolerated in a RAM array, such solutions are less desirable in a CAM arrays. Moreover, adding error detection schemes to CAM arrays increase the size (and, hence, the cost) of the CAM arrays, and further increase power consumption.

Accordingly, what is needed is a CAM circuit that addresses the soft error problem associated with the low power CAM operating environment without greatly increasing the cost and power consumption of the CAM circuit.

SUMMARY

The present invention is directed to a CAM circuit that addresses the soft error problem associated with the low power CAM operating environment by providing a doped layer below both the logic and memory portions of each CAM cell that attracts electrons/holes generated by high energy particles (e.g., alpha particles), thereby reducing the chance of "soft error" discharge without greatly increasing the cost and power consumption of the CAM circuit.

In accordance with a first embodiment of the present invention, each CAM cell of the CAM circuit includes an SRAM cell and a comparator (logic) circuit, wherein both the SRAM cell and the comparator circuit are formed using at least one n-channel transistor having an n-doped storage region (junction node) formed in a p-type well, which in turn is formed in a p-type substrate. In this first embodiment, an n-type doped region is formed between the p-type well and the p-type substrate (i.e., below the n-doped storage regions of each n-channel transistor). Because the n-type doped layer is formed using a dopant having an opposite conductivity type than that of the well region and substrate, the n-type doped layer attracts electrons generated on either side of its boundary by energetic particles passing through the substrate. Accordingly, fewer electrons gather into the n-doped storage regions forming the transistor junctions of the SRAM cell and comparator circuit of each CAM cell. As a result, each CAM cell has a greater resistance to data corruption than that of conventional CAM structures, thereby facilitating the fabrication of CAM arrays having low operating voltages.

In accordance with a second embodiment of the present invention, the SRAM cell and comparator circuit of each CAM cell are formed using at least one p-channel transistor having an p-doped storage region formed in an n-type well, which in turn is formed in an n-type substrate. In this second embodiment, a p-type doped region is formed between the n-type well and the n-type substrate.

In accordance with a third embodiment of the present invention, each CAM cell of the CAM circuit includes a DRAM cell and a comparator (logic) circuit, wherein both the DRAM cell and the comparator circuit are formed using n-channel transistors having an n-doped storage region (junction node) formed in a p-type well, which in turn is formed in a p-type substrate. In this embodiment, an n-type doped region is formed between the p-type well and the p-type substrate (i.e., below the n-doped storage regions of each n-channel transistor). Alternatively, both the DRAM cell and the comparator circuit are formed using p-channel transistors having a p-doped storage region (junction node) formed in an n-type well, which in turn is formed in an n-type substrate. Similar to the SRAM embodiments, each CAM cell has a greater resistance to data corruption than that of conventional CAM structures, thereby facilitating the fabrication of CAM arrays having low operating voltages.

The present invention will be more fully understood in view of the following description and drawings.

DETAILED DESCRIPTION

The present invention is described below with specific reference to binary SRAM CAM cells and ternary DRAM CAM cells. However, it is noted that the present invention can be extended to include other types of CAM cells, including ternary and quad (four-state) SRAM CAM cells, as well as binary DRAM CAM cells. Further, the specific CAM cell embodiments described herein are intended to be exemplary, and not limiting (unless otherwise specified in the claims).

Figure 2:
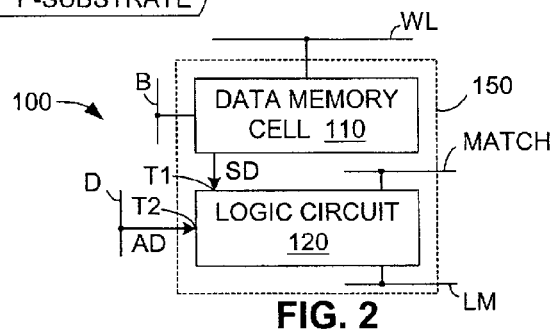
FIG. 2 is a block diagram showing a CAM cell in accordance with the present invention.

FIG. 2 is a block diagram showing a simplified CAM cell 100 in accordance with the present invention. CAM cell 100 includes a data memory cell 110 and a comparator (logic) circuit 120 that are fabricated using CMOS techniques. In one embodiment, both data memory cell 110 and comparator circuit 120 are formed using at least one n-channel transistor having an n-doped storage region (junctions) formed in a p-type well, which in turn is formed in a p-type substrate. In another embodiment, both data memory cell 110 and comparator circuit 120 are formed using at least one p-channel transistor having a p-doped storage region formed in an n-type well, which in turn is formed in an n-type substrate. CAM cell 100 operates in the manner described below.

In accordance with the present invention, a doped layer 150 is formed under data memory cell 110 and logic circuit 120, where the doped layer 150 has a conductivity type that is opposite that of the well region and substrate on which the transistors of data memory cell 110 and logic circuit 120 are formed. For example, when data memory cell 110 and logic circuit 120 include n-channel transistors having n-doped storage regions formed in p-type wells on p-type substrates, doped layer 150 is formed using n-type dopant material. Conversely, when data memory cell 110 and logic circuit 120 include p-channel transistors having p-doped storage regions formed in n-type wells on n-type substrates, doped layer 150 is formed using p-type dopant material. Because doped layer 150 has an opposite conductivity type to that of the well region, doped layer 150 attracts electron/hole pairs on either side of its boundary so that fewer hole pairs gather into the doped storage regions forming the transistor junctions of data memory cell 110 and logic circuit 120. As a result, CAM cell 100 has a greater resistance to data corruption than that of conventional CAM structures, thereby facilitating the fabrication of CAM arrays having low operating voltages.

Figure 1:
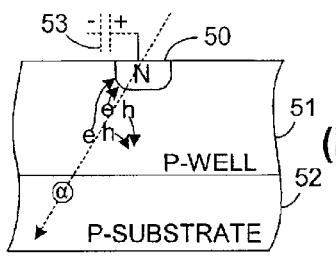
FIG. 1 is simplified cross sectional view showing a node of an IC device.
Figure 3A:
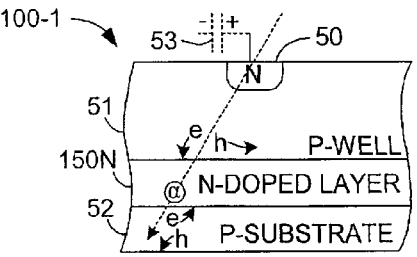
FIGS. 3(A) and 3(B) are a simplified cross sectional views showing portions of the CAM cell shown in FIG. 2 according to alternative first and second embodiments of the present invention.

FIG. 3(A) is a cross-sectional view showing a portion of a CAM cell 100-1, which is consistent with CAM cell 100 of FIG. 1, and formed in accordance with an embodiment of the present invention. Similar to conventional n-channel transistor structures, such as that described above with reference to FIG. 1, each n-channel transistor of CAM cell 100-1 includes an n-doped storage region (junction node) 50 formed in a p-type well (P-WELL) 51, which in turn is formed on a p-type substrate (P-SUBSTRATE) 52. In this embodiment, an n-type doped layer (N-DOPED LAYER) 150N is formed using an n-type dopant according to known deep-well formation techniques such that doped layer 150N is located between p-type well 51 and p-type substrate 52, and below n-doped storage region 50. Similar to the example described with reference to FIG. 1, dashed line capacitor 53 represents the capacitance of junction 50, and indicates that node 50 stores a positive charge.

As indicated in FIG. 3(A), if an energetic particle, such as an alpha particle ($\alpha$), from the environment or surrounding structure strikes the n-type diffusion of junction node 50, then electrons (e) and holes (h) will be generated within the underlying body of semiconductor material (e.g., in P-well 51 or p-type substrate 53). However, unlike the conventional structure described above with reference to FIG. 1, many of these free electrons and holes travel to doped layer 150N and P-well 51/P-substrate 52, respectively, thereby reducing the chance of a short circuit current that reduces the charge stored at junction node 50. Therefore, when node 50 forms a drain in an SRAM cell of CAM cell 100-1, the stored logic state of the SRAM cell is not subjected to "soft errors".

Figure 3B:
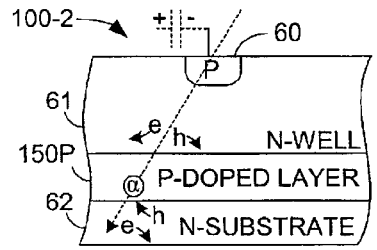

FIG. 3(B) is a cross-sectional view showing a portion of a CAM cell 100-2, which is also consistent with CAM cell 100 of FIG. 1, and formed in accordance with another embodiment of the present invention. Similar to the n-channel transistors structure described above, each p-channel transistor of CAM cell 100-2 includes a p-doped storage region (junction node) 60 formed in an n-type well (N-WELL) 61, which in turn is formed over an n-type substrate (N-SUBSTRATE) 62. In this embodiment, a p-type layer (P-DOPED LAYER) 150P is formed using a p-type dopant according to known deep-well formation techniques such that doped layer 150P is located between n-type well region 61 and n-type substrate 62. As indicated in FIG. 3(B), by introducing doped layer 150P into CAM cell 100-2, if an energetic alpha-particle (α) strikes the p-type diffusion of node 60, then many of these free holes and electrons travel to doped layer 150P and n-well 61/n-substrate 62, respectively, thereby reducing the chance of a short circuit current. Therefore, similar to the embodiment discussed above with reference to FIG. 3(A), when node 60 forms a drain in an SRAM cell of CAM cell 100-2, the stored logic state of the SRAM cell is not subjected to "soft errors".

The operation of CAM cells formed in accordance with the present invention will now be discussed in additional detail.

Referring again to FIG. 2, SRAM data memory cell 100 is controlled by a word line W to store a data value transmitted on bit line B, and transmits this stored data (SD) value to a first terminal T1 of comparator circuit 120. Comparator circuit 120 also receives an applied data (AD) value at a second terminal T2 from an external data line D. Comparator circuit 120 is controlled by stored data value SD and applied data value AD to open or close a charge/discharge path extending between a match line MATCH and a charge/discharge line LM. For example, when stored data value SD and applied data value AD are not equal (a no-match condition), comparator circuit 120 opens the charge/discharge path, thereby connecting match line MATCH to charge/discharge line LM. Alternatively, when the stored data value and the applied data value are equal (a "match" condition), comparator circuit 120 closes the charge/discharge path, and match line MATCH remains isolated from charge/discharge line LM.

During operation, in accordance with a predefined convention, comparator circuit 120 is controlled by stored data value SD and applied data value AD to maintain a preset voltage level on match line MATCH, or to charge/discharge the match line by opening the charge/discharge path. In an alternative embodiment, match line MATCH may be initially discharged, and charge/discharge line LM is maintained in a high voltage state during a compare operation such that match line MATCH is charged to the high voltage in the event of a match (or no-match) condition. Other alternative embodiments are also possible, such as discharging the match line when a match condition exists, or charging the match line when a no-match condition exists. The present invention is intended to cover all such alternative embodiments.

Figure 4:
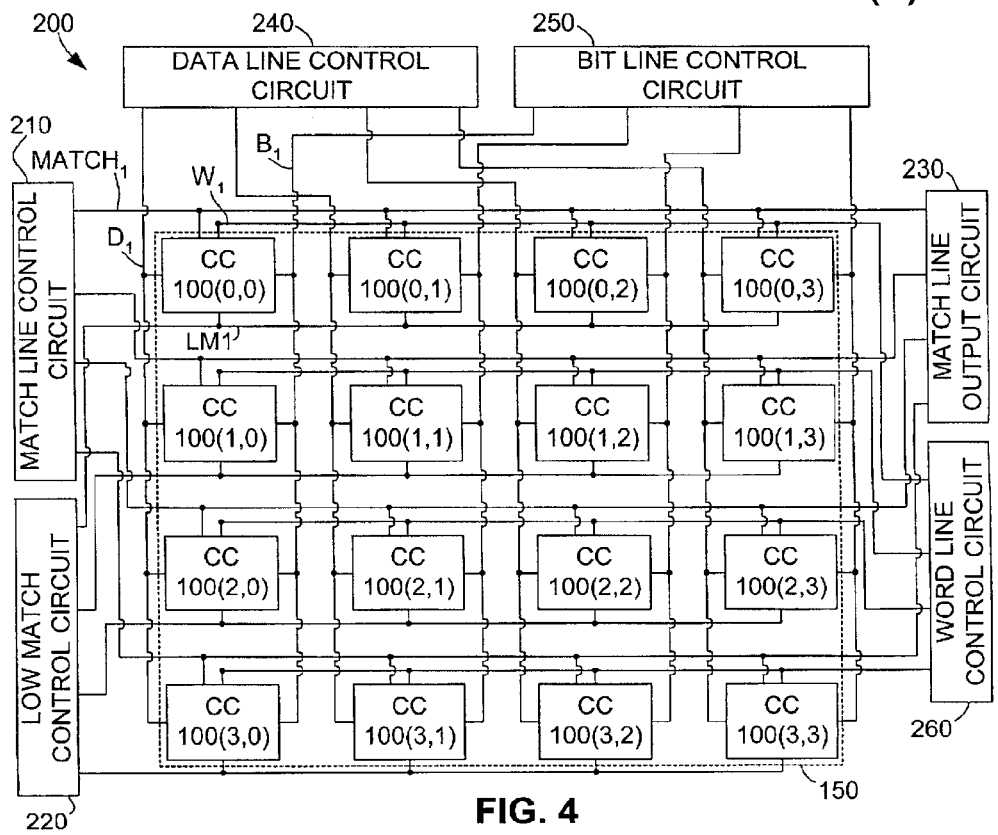
FIG. 4 is a simplified diagram showing a CAM CAM array incorporating the CAM cell of FIG. 2.

FIG. 4 is a simplified schematic diagram showing a CAM cell array 200 including CAM cells (CC) 100(0,0) through 100(3,3) that are arranged in rows and columns. Each CAM cell 100(0,0) through 100(3,3) is essentially identical to CAM cell 100 (see FIG. 2). Each column of CAM cells (e.g., cells 100(0,0) through 100(3,0)) is connected to an associated data line (e.g., data line $D_1$) and an associated bit line (e.g., data line $B_1$). The bit lines are used to transmit data values to the data memory cells (i.e., data memory cell 110; see FIG. 2) of each CAM cell in the associated column during data write operations. The data lines are used to transmit applied data values to the comparison circuit (e.g., comparison circuit 120; see FIG. 2) of each CAM cell in the associated column during comparison operations. Similarly, each row of CAM cells (e.g., cells 100(0,0) through 100(0,3)) is connected to an associated match line (e.g., data line $MATCH_1$), an associated low match (discharge) line (e.g., low match line $LM_1$), and an associated word line (e.g., low match line $W_1$). The word lines are used to address the data memory cells (i.e., data memory cell 110; see FIG. 2) of each CAM cell in the associated row during data write operations. The match line associated with each row of CAM cells is discharged to the associated low match line in the manner described above when any of the CAM cells in the row detect a no-match condition between the applied data value on the associated data line and the stored (first) data value in that CAM cell. Stated differently, when any CAM cell in a given row (e.g., any of CAM cells 100(0,0), 100(0,1), 100(0,2), and 100(0,3)) detects a no-match condition, then the associated match line (e.g., match line $MATCH_1$) is discharged to the associated low match line (e.g., low match line $LM_1$).

In addition to CAM cells 100(0,0) through 100(3,3), CAM cell array 200 includes a match line control circuit 210, a low match control circuit 220, a match line output (sensing) circuit 230, a data line control circuit 240, a bit line control circuit 250, and a word line control circuit 260.

Match line control circuit 210 generates a pre-charge on each of several match lines (e.g., match line $MATCH_1$) prior to comparison operations. Such match line control functions are well known in the art.

Low match control circuit 220 controls the low match lines (e.g., low match line $LM_1$) such that they float during non-active periods, and are pulled down to a pre-determined low voltage (e.g., ground or 0 volts) during compare operations. For example, during a standby operation in which the comparator circuits of the CAM cells connected to low match line $LM_1$ are not active, low match line $LM_1$ is allowed to float. As a result, low match control circuit 220 provides a power savings selectively de-coupling the un-powered low match line $LM_1$. However, during a compare operation, low match line $LM_1$ is maintained at a logic voltage level by low match control circuit 220. As a result, proper voltages required for the compare operation are provided. Note that, while the embodiments described below couple the low match line to the comparator circuit of selected CAM cells, other variations (not shown) may couple the $V_{ss}$ voltage supply source to the comparator instead. However, the resulting CAM cell array will not have the power savings described when using low match control circuit 220.

Match line output circuit 230 senses the charged/discharged state of each match line during compare operations, and passes the resulting match information to associated control circuitry (not shown). Such line sensing functions are well known in the art. Although shown as separate circuits, in an alternative embodiment match line output circuit 230 and match line control circuit 210 can be combined.

Data line control circuit 240, bit line control circuit 250, and word line control circuit 260 perform associated functions using known methods. Data line control circuit 240 transmits applied data signals to selected data lines (e.g., data line $D_1$) during compare operations. Bit line control circuit 250 transmits data signals to selected bit lines (e.g., data line $B_1$) during data write operations. Finally, word line control circuit 260 transmits address signals to selected word lines (e.g., word line $W_1$) during data write operations.

The operation of CAM array 200 is described below with respect to specific embodiments of CAM cell 100. Note that the disclosed specific embodiments are intended to be illustrative, and not limiting.

Figures 5, 6:
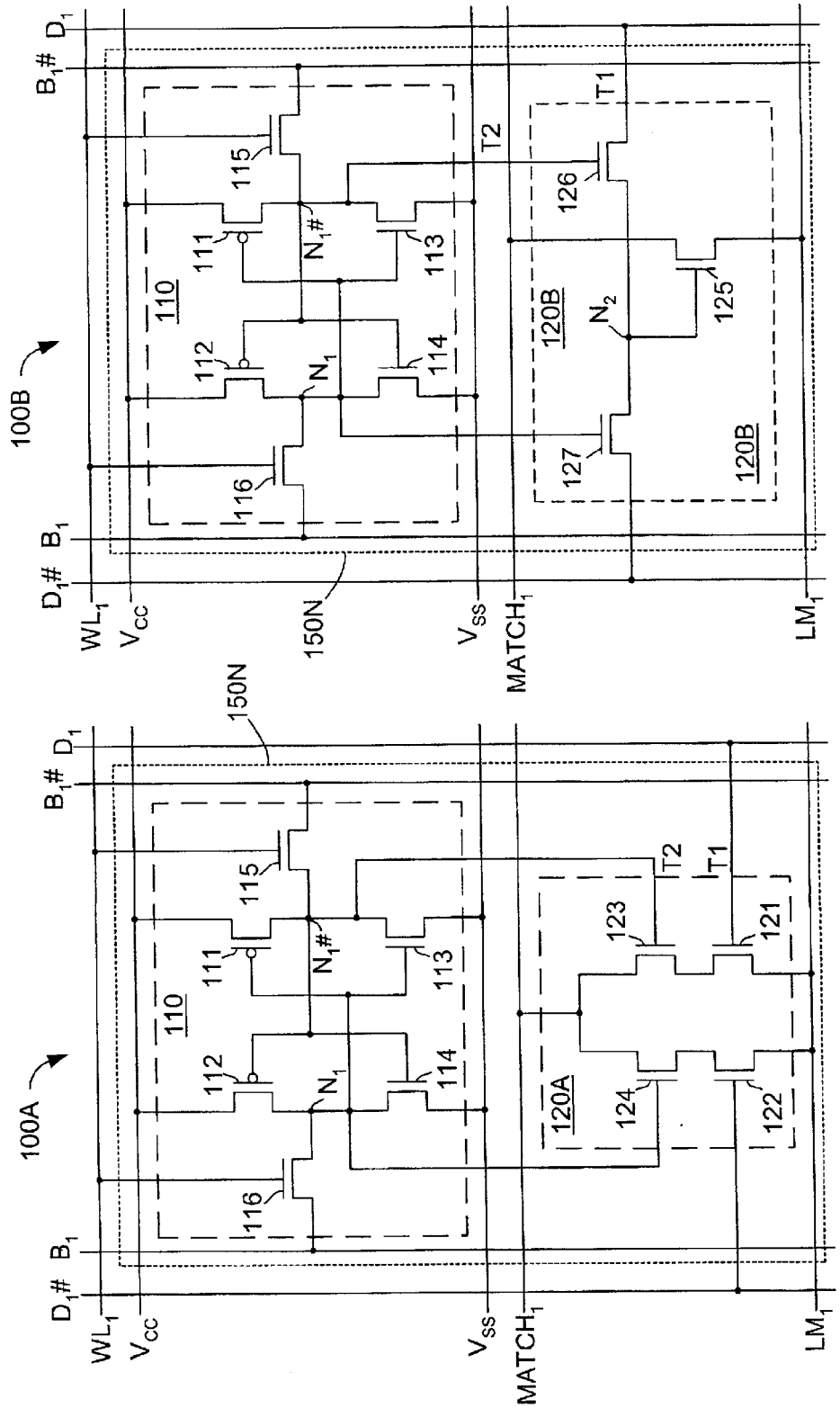
FIG. 5 is a schematic diagram showing a CAM cell of the CAM array shown in FIG. 4 in accordance with a first specific embodiment of the present invention.
FIG. 6 is a schematic diagram showing a CAM cell of the CAM array shown in FIG. 4 in accordance with a second specific embodiment of the present invention.

FIG. 5 is a schematic diagram showing a CAM cell 100A in accordance with a first specific embodiment of the present invention. Similar to CAM cell 100 (see FIG. 2), CAM cell 100A includes an SRAM cell 110 and a comparator circuit 120A that are formed over an n-type doped layer 150N. CAM cell 100A is coupled to bit lines $B_1$ and $B_1\#$ ("#" is used herein to denote an inverted signal), data lines $D_1$ and $D_1\#$, word line $WL_1$, a $V_{cc}$ voltage supply source, a $V_{ss}$ voltage supply source, low match line $LM_1$, and match line $MATCH_1$.

Referring to the upper portion of FIG. 5, SRAM cell 110 includes p-channel transistors 111 and 112 and n-channel transistors 113–116, which are fabricated as described above. Transistors 111 and 113 are connected in series between the $V_{cc}$ voltage supply source and the $V_{ss}$ voltage supply source, and transistors 112 and 114 are also connected in series between the $V_{cc}$ voltage supply source and the $V_{ss}$ voltage supply source. Transistors 111 and 113 and transistors 112 and 114 of SRAM cell 110 are cross-coupled to form a storage latch. Specifically, a first storage node $N_1\#$ that is located between transistors 111 and 113 is connected to the gate terminals of transistors 112 and 114, and a second storage node $N_1$ that is located between transistors 112 and 114 is connected to the gate terminals of transistors 111 and 113. Access transistor 115 is connected between bit line $B_1\#$ and node $N_1\#$. Access transistor 116 is connected between bit line $B_1$ and node $N_1$. The gates of access transistors 115 and 116 are connected to word line $WL_1$. Note that SRAM cell 110 only stores a single data value (bit) that is either a logic high value (e.g., a high voltage signal is maintained at node $N_1$ and a low voltage signal is maintained at inverted node $N_1\#$), or a logic low value (e.g., a low voltage signal is maintained at node $N_1$ and a high voltage signal is maintained at inverted node $N_1\#$).

Referring now to the lower portion of FIG. 5, comparator circuit 120A includes n-channel transistors 121–124. Transistors 121 and 123 are connected in series between match line $MATCH_1$ and low match line $LM_1$, and transistors 122 and 124 are also connected in series between match line $MATCH_1$ and low match line $LM_1$. The gate terminal of transistor 121 is connected to data line $D_1$, and the gate terminal of transistor 123 is connected to node $N_1\#$. Therefore, transistors 121 and 123 are turned on to open a first path between match line $MATCH_1$ and low match line $LM_1$ only when a high applied data signal transmitted on data line $D_1$ and a high data signal is stored at node $N_1\#$. Similarly, the gate terminal of transistor 122 is connected to data line $D_1\#$, and the gate terminal of transistor 124 is connected to node $N_1$. Therefore, transistors 122 and 124 are turned on to open a second path between match line $MATCH_1$ and low match line $LM_1$ only when a high applied data signal transmitted on data line $D_1\#$ and a high data signal is stored at node $N_1$.

Examples of standby, write, read, and compare operations of CAM cell 100A will now be described.

In a standby operation, word line $WL_1$ and data lines $D_1$ and $D_1\#$ are pulled down to logic low values, thereby turning off transistors 115 and 116, 121, and 122, respectively. The value of match line $MATCH_1$ does not matter and is preferably left in its last state. Under these conditions, SRAM cell 110 latches the values at node $N_1$ and the inverted node $N_1\#$.

To write a data value (e.g., a logic high value) to SRAM cell 110, bit line $B_1$ is held to a first data value (e.g., a logic high value) and bit line $B_1\#$ is held to the inverse of the first write data value (e.g., a logic low value). Data lines $D_1$ and $D_1\#$ are held to logic low values, thereby turning of transistors 121 and 122, respectively. Turned off transistors 121 and 122 de-couple match line $MATCH_1$ from low match line $LM_1$, thereby preventing the write operation from changing the state of match line $MATCH_1$. Word line $WL_1$ is then pulled up to a logic high value to turn on transistors 114 and 115, thereby passing the logic values from bit lines $B_1$ and $B_1\#$ to the latch formed by transistors 111–114. To write a logic high value to SRAM cell 110, bit line $B_1$ is held to a logic high value (i.e., a first write data value) and bit line $B_1\#$ is held to a logic low value. Under these conditions, the logic high value of word line $WL_1$ turns on transistors 115 and 116 to couple the logic low value on bit line $B_1\#$ to node $N_1\#$ and the logic high value on bit line $B_1$ to node $N_1$ thereby pulling up node $N_1$ to a logic high value and pulling down node $N_1\#$ to a logic low value. As a result, SRAM cell 110 stores a logic high value. Conversely, to write a logic low value to SRAM cell 110, bit line $B_1$ is held to a logic low value (i.e., a first write data value) and bit line $B_1\#$ is held to a logic high value. Under these conditions, the logic high value of word line $WL_1$ turns on transistors 115 and 116 to pull up node $N_1\#$ to a logic high value and node $N_1$ to a logic low value in a manner similar to that described above. As a result, SRAM cell 110 stores a logic low value.

A compare operation of CAM cell 100A will now be described. During a compare operation, match line $MATCH_1$ is pre-charged to a logic high value. Both low match line and word line $WL_1$ are held at logic low values. The value of bit lines $B_1$ and $B_1\#$ are not utilized in the compare operation, and are therefore left in their previous states. In the present example, a "match" condition is indicated during a compare operation by a high logic value on match line $MATCH_1$, and a no-match condition is indicated during a compare operation by a low logic value on match line $MATCH_1$. Accordingly, in a match condition, match line $MATCH_1$ remains isolated from low match line $LM_1$ by comparator circuit 120A. Conversely, during a no-match condition, match line $MATCH_1$ is coupled to low match line $LM_1$ through comparator circuit 120A.

FIG. 6 is a schematic diagram showing a CAM cell 100B in accordance with a second specific embodiment of the present invention. CAM cell 100A includes SRAM cell 110, which is described above with reference to FIG. 5, and a comparator circuit 120B that operates as described below. Similar to CAM cell 100A (discussed above, SRAM cell 110 and comparator circuit 120B are formed over n-type doped layer 150N.

Referring to the lower portion of FIG. 6, comparator circuit 120B includes n-channel transistors 126, 127 and 128. Transistor 128 is connected between match line $MATCH_1$ and low match line $LM_1$. Transistor 126 has a first terminal connected to data line $D_1$, a gate terminal connected to inverted node $N_1\#$, and a second terminal connected to a node $N_2$, which is connected to the gate terminal of transistor 128. Accordingly, transistor 128 is turned on during a compare operation to open a discharge path between match line MATCH₁ and low match line LM₁ when both a high voltage signal is stored at inverted node N₁# (which turns on transistor 126), and a high voltage signal is applied to data line D₁ (which is passed by turned-on transistor 126). Similarly, transistor 127 has a first terminal connected to inverted data line D₁#, a gate terminal connected to node N₁, and a second terminal connected to node N₂. Accordingly, transistor 128 is also turned on during a compare operation when both a high voltage signal is stored at node N₁ (which turns on transistor 127) and a high voltage signal is applied to inverted data line D₁# (which is passed by turned-on transistor 127).

Figure 7:
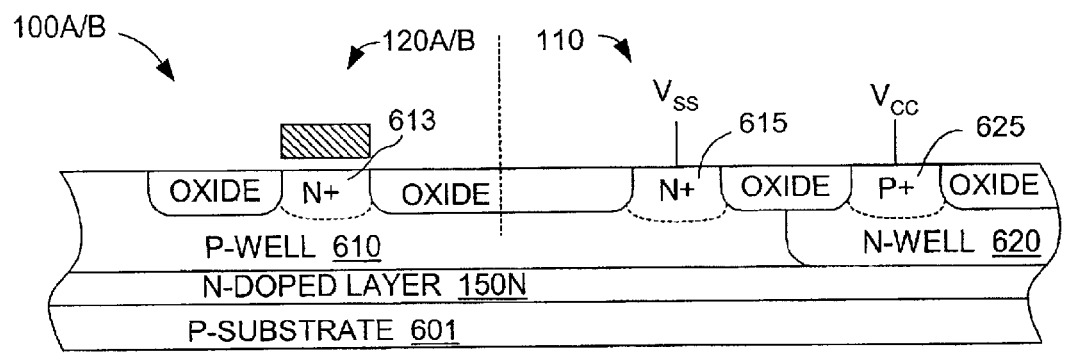
FIG. 7 is a simplified cross sectional view showing a portion of a CAM cell incorporating an n-type layer according to a third specific embodiment of the present invention.

FIG. 7 is a simplified cross sectional view showing a portion of a CAM cell 100A/B, which is consistent with either CAM cell 100A or CAM cell 100B (described above). CAM cell 100A/B is formed on a p-type substrate (P-SUBSTRATE) 601, and includes a p-type well region (P-WELL) 610 having a higher doping concentration (e.g., $10^{17}$ to $10^{18}$ atoms per ccm) than that of p-type substrate 601 (e.g., $10^{15}$ atoms per ccm), and an n-type well region (N-WELL) 620 formed according to known techniques. As described above with reference to FIGS. 5 and 6, CAM cell 100A/B includes an SRAM (memory) cell 110 and a comparator circuit 120A/B, which are described above with reference to FIGS. 5 and 6. As described above, comparator circuit 120A/B includes at least one n-channel transistor formed by an n-type diffusion region 613 that is formed in p-type well region 610 and has a higher doping concentration (e.g., $10^{20}$ atoms per ccm) than that of p-type well region 610. Similarly, memory circuit 110 includes at least one n-channel transistor formed by an n-type diffusion region 615 that is formed in p-type well region 610, and at least one p-channel transistor formed by a p-type diffusion region 625 that is formed in n-type well region 620. In one embodiment, n-type doped layer 150N has a doping concentration (e.g., $10^{16}$ atoms per ccm or greater) that is greater than that of p-type substrate 601.

Figure 8:
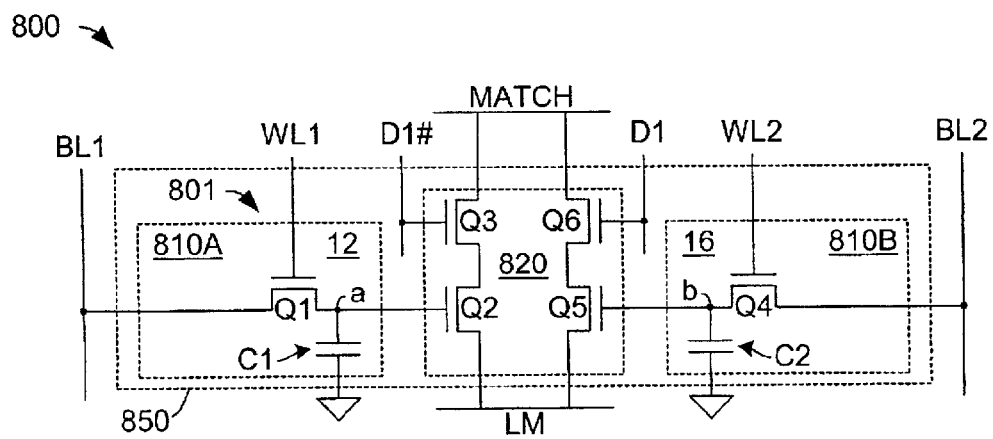
FIG. 8 is a schematic diagram showing a ternary DRAM-based CAM according to a fourth embodiment of the present invention.

FIG. 8 is a schematic diagram showing a portion of a ternary DRAM-based CAM 800 according to a third embodiment of the present invention. CAM circuit 800 includes an array of ternary CAM cells 801 (one shown), each CAM cell 801 including a first one-transistor (1T) DRAM cell 810A, a second 1T DRAM cell 810B, and a logic circuit 820 made up of transistors Q2 through Q6. DRAM cell 810A includes transistor Q1 and a capacitor structure C1, which combine to form a storage node a that receives a data value from bit line BL1 during write operations, and applies the stored data value to the gate terminal of transistor Q2 of comparator circuit 820. Transistor Q2 is connected in series with transistor Q3, which is controlled by a data signal transmitted on inverted data line D1#, between a match line MATCH and a discharge line LM. DRAM cell 810B includes transistor Q3 and a capacitor structure C2, which combine to form a storage node b that receives a data value from bit line BL2, and applies the stored data value to the gate terminal of transistor Q4 of comparator circuit 820. Transistor Q4 is connected in series with transistor Q5, which is controlled by a data signal transmitted on inverted data line D1#, between the match line and the discharge line. The operation of CAM cell 801 is similar to that described above, with the exception that a "don't care" state is stored when both DRAM cells 810A and 810B store logic low data values, thereby preventing discharge of the match line no matter what data values are transmitted on data lines D1 and D1#.

In accordance with the present invention, transistors Q1 through Q6 of CAM cell 801 are formed over a doped region 850 that is similar to n-doped layer 150N shown in FIG. 7. In particular, transistors Q1 through Q6, which form DRAM cells 810A and 810B and comparator 820, are all n-channel transistors formed by an n-type diffusion region that is formed in p-type well region, which in turn is formed over a p-type substrate, similar to the structure shown in FIG. 7. In accordance with the third embodiment, all six transistors (i.e., both the memory and the logic portions of CAM cell 810) are formed over n-type doped region 850, which is located between the p-type well region and the p-substrate. In an alternative embodiment, transistors Q1 through Q6 are all p-channel transistors formed by an p-type diffusion region that is formed in n-type well region, which in turn is formed over a n-type substrate, and doped region 850 is formed using a p-type dopant.

Although the present invention is described with reference to binary SRAM CAM cells and ternary DRAM CAM cells, those of ordinary skill in the art will recognize that the present invention can be extended to include ternary and quad (four-state) SRAM CAM cells, and binary and quad DRAM CAM cells. In view of these and other possible modifications, the invention is limited only by the following claims.

I claim:

1. A content addressable memory (CAM) circuit comprising a plurality of CAM cells, each CAM cell including a memory cell and a logic circuit formed on a substrate having a first conductivity type,
    wherein both the memory cell and the logic circuit include at least one transistor including a diffusion region of a second conductivity type formed in a well region of the first conductivity type, and
    wherein the CAM circuit comprises a doped layer formed under the well region below both the memory cell and the logic circuit, the dopant layer including a dopant of the second conductivity type.

2. The CAM circuit according to claim 1, wherein the first conductivity type comprises p-type dopant and the second conductivity type comprises n-type dopant.

3. The CAM circuit according to claim 1, wherein the first conductivity type comprises n-type dopant and the second conductivity type comprises p-type dopant.

4. The CAM circuit according to claim 1,
    wherein the memory cell is a static random access memory (SRAM) cell including a p-channel transistor having a junction node formed by a p-type diffusion region formed in an n-type well region, and a first n-channel transistor having a junction node formed by a first n-type diffusion region formed in a p-type well region,
    wherein the logic circuit comprises a second n-channel transistor having a junction node formed by a second n-type diffusion region formed in the p-type well region, and
    wherein the doped layer comprises n-type dopant extending under the p-type well region below both the first and second n-type diffusion regions.

5. The CAM circuit according to claim 1, wherein the doped layer has a dopant concentration that is greater than a dopant concentration of the substrate.

6. The CAM circuit according to claim 1,
    wherein the memory cell of each CAM cell stores an associated stored data value,
    wherein the logic circuit of each CAM cell includes a first control terminal connected to receive the stored data value of the stored memory cell, a second control terminal connected to receive an applied data value, and wherein the logic circuit of each CAM cell is arranges such that, during a compare operation, the logic circuit selectively opens a path between a match line and a discharge line when the applied data value fails to match the stored data value.

7. The CAM circuit according to claim 1, wherein the memory cell comprises a static random access memory (SRAM) cell including:
- a first p-channel transistor connected between a first voltage source and the second node, the first p-channel transistor having a gate terminal connected to the first node;
- a second p-channel transistor connected between the first voltage source and the first node, the second p-channel transistor having a gate terminal connected to the second node;
- a first n-channel transistor connected between a second voltage source and the second node, the first n-channel transistor having a gate terminal connected to the first node;
- a second n-channel transistor connected between the second voltage source and the first node, the second n-channel transistor having a gate terminal connected to the second node;
- a first access transistor connected between a first data line and the first node, the first pass transistor having a gate terminal connected to a word line; and
- a second access transistor connected between a second data line and the second node, the second pass transistor having a gate terminal connected to the word line.

8. The CAM circuit according to claim 7, wherein the logic circuit comprises:
- a first pass transistor having a gate terminal connected receive the applied data signal; and
- a second pass transistor connected in series with the first pass transistor and having a gate terminal connected to one of the first node and the second node.

9. The CAM circuit according to claim 7, wherein the logic circuit comprises:
- a first pass transistor having a gate terminal connected the second node, a first terminal connected to receive the first data signal, and a second terminal,
- a second pass transistor having a gate terminal connected to the first node, a first terminal connected to receive the first data signal, and a second terminal; and
- a third pass transistor having a gate terminal to the second terminals of the first and second pass transistors,
- wherein the third pass transistor is connected between the match line and the discharge line.

10. The CAM circuit according to claim 1,
wherein the memory cell comprises a dynamic random access memory (DRAM) cell including a first n-channel transistor connected between a first bit line and a storage node, and
wherein the logic circuit comprises a second n-channel transistor having a gate terminal connected to the storage node of the DRAM cell, and a third n-channel transistor connected in series with the second n-channel transistor and having a gate terminal connected to receive the applied data value.

11. A content addressable memory (CAM) circuit fabricated on a p-type substrate having a p-type well region formed thereon, wherein the CAM circuit comprises:
- a plurality of CAM cells, each CAM cell including a memory cell having a first n-doped storage region formed in the p-type well region, and a logic circuit including a second n-doped storage region formed in the p-type well; and
- an n-type doped layer formed under the p-type well region.

12. The CAM circuit according to claim 11, further comprising an n-type well region formed adjacent to the p-type well region,
wherein the memory cell includes a p-channel transistor including a p-doped storage region formed in the n-type well region, and
wherein the n-type doped layer extends under the n-type well region.

13. The CAM circuit according to claim 11,
wherein the memory cell of each CAM cell stores an associated stored data value,
wherein the logic circuit of each CAM cell includes a first control terminal connected to receive the stored data value of the SRAM cell, a second control terminal connected to receive an applied data value, and
wherein the logic circuit of each CAM cell is arranges such that, during a compare operation, the logic circuit selectively opens a path between a match line and a discharge line when the applied data value fails to match the stored data value.

14. The CAM circuit according to claim 13, wherein the memory cell comprises a static random access memory (SRAM) cell including:
- a first p-channel transistor connected between a first voltage source and the second node, the first p-channel transistor having a gate terminal connected to the first node;
- a second p-channel transistor connected between the first voltage source and the first node, the second p-channel transistor having a gate terminal connected to the second node;
- a first n-channel transistor connected between a second voltage source and the second node, the first n-channel transistor having a gate terminal connected to the first node;
- a second n-channel transistor connected between the second voltage source and the first node, the second n-channel transistor having a gate terminal connected to the second node;
- a first access transistor connected between a first data line and the first node, the first pass transistor having a gate terminal connected to a word line; and
- a second access transistor connected between a second data line and the second node, the second pass transistor having a gate terminal connected to the word line.

15. The CAM circuit according to claim 14, wherein the logic circuit comprises:
- a first pass transistor having a gate terminal connected receive the applied data signal; and
- a second pass transistor connected in series with the first pass transistor and having a gate terminal connected to one of the first node and the second node.

16. The CAM circuit according to claim 14, wherein the logic circuit comprises:
- a first pass transistor having a gate terminal connected the second node, a first terminal connected to receive the first data signal, and a second terminal, a second pass transistor having a gate terminal connected to the first node, a first terminal connected to receive the first data signal, and a second terminal; and a third pass transistor having a gate terminal to the second terminals of the first and second pass transistors, wherein the third pass transistor is connected between the match line and the discharge line.

17. The CAM circuit according to claim 11, wherein the memory cell comprises a dynamic random access memory (DRAM) cell including a first n-channel transistor connected between a first bit line and a storage node, and wherein the logic circuit comprises a second n-channel transistor having a gate terminal connected to the storage node of the DRAM cell, and a third n-channel transistor connected in series with the second n-channel transistor and having a gate terminal connected to receive the applied data value.

* * * * *